United States Patent
Park et al.

(10) Patent No.: US 11,935,474 B2
(45) Date of Patent: Mar. 19, 2024

(54) DISPLAY DEVICE AND OPERATING METHOD OF DISPLAY DEVICE

(71) Applicant: Samsung Electronics Co., Ltd., Suwon-si (KR)

(72) Inventors: Unki Park, Suwon-si (KR); Sewhan Na, Suwon-si (KR); Jonghyuk Lee, Suwon-si (KR); Hyeonsu Park, Suwon-si (KR); Hyunwook Lim, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 17/957,439

(22) Filed: Sep. 30, 2022

(65) Prior Publication Data
US 2023/0108159 A1   Apr. 6, 2023

(30) Foreign Application Priority Data

Oct. 5, 2021 (KR) .................. 10-2021-0131973
Jul. 27, 2022 (KR) .................. 10-2022-0093455

(51) Int. Cl.
| G06V 40/13 | (2022.01) |
| G09G 3/3233 | (2016.01) |
| H10K 59/65 | (2023.01) |

(52) U.S. Cl.
CPC .......... *G09G 3/3233* (2013.01); *H10K 59/65* (2023.02); *G09G 2300/0439* (2013.01); *G09G 2320/0686* (2013.01)

(58) Field of Classification Search
None
See application file for complete search history.

(56) References Cited

U.S. PATENT DOCUMENTS

| 10,573,236 B1* | 2/2020 | Gao .................. G09G 3/2044 |
| 10,971,050 B2 | 4/2021 | Lin et al. |
| 11,030,938 B2 | 6/2021 | Zeng et al. |
| 11,074,856 B2 | 7/2021 | Zhao et al. |
| 2014/0232735 A1 | 8/2014 | Jeong et al. |
| 2020/0211480 A1 | 7/2020 | Xiang et al. |
| 2022/0368833 A1* | 11/2022 | Kanai ................ H04N 23/63 |

FOREIGN PATENT DOCUMENTS

| KR | 10-0646183 B1 | 11/2006 |
| KR | 10-1152455 B1 | 6/2012 |

\* cited by examiner

*Primary Examiner* — Joseph R Haley
(74) *Attorney, Agent, or Firm* — Harness, Dickey & Pierce, P.L.C.

(57) ABSTRACT

A display device includes a display panel including an under display camera (UDC) region and a non-UDC region, the UDC region including a plurality of sub-regions, and processing circuitry configured to, receive image data, select at least one first filter from a plurality of filters based on a spatial coordinate value of the received image data, the plurality of filters corresponding to a respective sub-region of the plurality of sub-regions, and perform first pixel rendering for the UDC region based on the at least one first filter and the image data, and the at least one first filter is generated based on a pixel arrangement pattern of the UDC region.

20 Claims, 11 Drawing Sheets

DISPLAY DEVICE AND OPERATING METHOD OF DISPLAY DEVICE

CROSS-REFERENCE TO RELATED APPLICATIONS

This U.S. non-provisional application claims the benefit of priority under 35 U.S.C. § 119 to Korean Patent Application Nos. 10-2021-0131973 and 10-2022-0093455, filed on Oct. 5, 2021 and Jul. 27, 2022 respectively, in the Korean Intellectual Property Office, the disclosures of each of which are incorporated by reference herein in their entireties.

BACKGROUND

Various example embodiments of the inventive concepts relate to a semiconductor device, and more particularly, to a display device including a camera module for controlling pixel rendering on image data, and/or an operating method of the display device, etc.

A display device includes a display panel displaying an image, a display driving circuit driving the display panel, and a processor. The processor may transmit image data and control pixel rendering on the image data. Recently, as the demand for multimedia devices has increased, the use of various display devices in which a camera module is embedded, has been increasing.

In an under-display camera (UDC) region in a display region, a camera module may be under the display panel. In this regard, in order to enable capturing of a subject through a part of a display active region in the UDC region, the configuration and/or arrangement of pixels in the UDC region may be different from the configuration and/or arrangement in the non-UDC region.

SUMMARY

Various example embodiments of the inventive concepts provide a display device for reducing, decreasing, and/or preventing image quality degradation in an under display camera (UDC) region and waste of hardware resources due to overlapping pixel rendering, and an operating method of the display device.

According to an aspect of at least one example embodiment of the inventive concepts, there is provided a display device includes a display panel including an under display camera (UDC) region and a non-UDC region, the UDC region including a plurality of sub-regions, and processing circuitry configured to, receive image data, select at least one first filter from a plurality of filters based on a spatial coordinate value of the received image data, the plurality of filters corresponding to a respective sub-region of the plurality of sub-regions, and perform first pixel rendering for the UDC region based on the at least one first filter and the image data, and the at least one first filter is generated based on a pixel arrangement pattern of the UDC region.

According to another aspect of at least one example embodiment of the inventive concepts, there is provided an operating method of a display device, the operating method includes receiving image data, selecting at least one first filter from a plurality of filters based on a spatial coordinate value of the received image data, the at least one first filter corresponding to a respective sub-region of a plurality of sub-regions of a display panel, the display panel including an under-display camera (UDC) region including the plurality of sub-regions and a non-UDC region, performing first pixel rendering on the UDC region based on the at least one first filter and the image data, and the at least one first filter is generated based on a pixel arrangement pattern of the UDC region.

According to another aspect of at least one example embodiment of the inventive concepts, there is provided a display device including a display panel including an under-display camera (UDC) region including a plurality of sub-regions and a non-UDC region, and processing circuitry configured to use a first rendering path on the UDC region and a second rendering path on the non-UDC region in parallel, and perform dithering on the UDC region based on a pixel arrangement pattern of the UDC region.

BRIEF DESCRIPTION OF THE DRAWINGS

Various example embodiments of the inventive concepts will be more clearly understood from the following detailed description taken in conjunction with the accompanying drawings in which.

DETAILED DESCRIPTION

Hereinafter, various example embodiments are described in connection with the accompanying drawings. Terms used with reference to the example embodiments of the inventive concepts are only used to describe specific example embodiments, and may not be intended to limit the scope of other example embodiments. The singular expression may include the plural expression unless the context clearly dictates otherwise. Terms used herein, including technical or scientific terms, may have the same meanings as commonly understood by one of ordinary skill in the art described in the inventive concepts.

Figure 1:
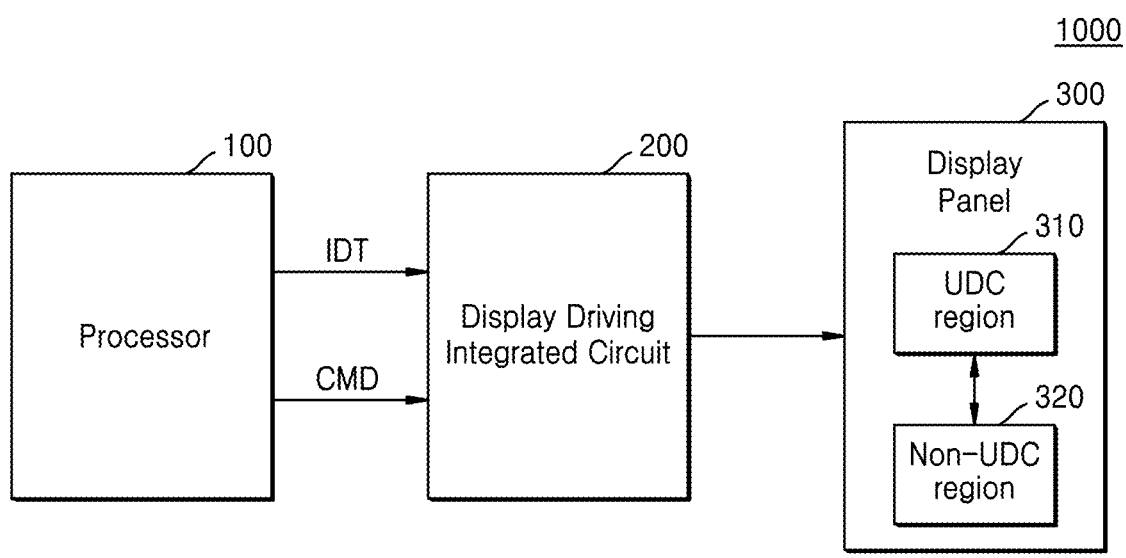
FIG. 1 is a block diagram illustrating a display system according to at least one example embodiment.

FIG. 1 is a block diagram illustrating a display system 1000 according to at least one example embodiment.

The display system 1000 according to at least one example embodiment may be mounted on an electronic device having an image display function. For example, the electronic device may include a smartphone, a personal computer (PC), a tablet, a portable multimedia player (PMP), a camera, a wearable device, an internet of things (IoT) device, a television, a digital video disk (DVD) player, a refrigerator, an air conditioner, an air purifier, a set-top box, a gaming system, a robot, a drone, various medical devices, a navigation device, a global positioning system (GPS) receiver, an advanced drivers and assistance system (ADAS), a vehicle device, furniture, and/or various measuring devices.

Referring to FIG. 1, the display system 1000 may include at least one processor 100, a display driving circuit 200 (and/or referred to as a display driving integrated circuit, etc.), and/or a display panel 300, etc., but the example embodiments are not limited thereto, and for example, the display system 1000 may include a greater or lesser number of constituent components. In at least one example embodiment, the display driving circuit 200 and the display panel 300 may be implemented as a single module, and the module may be referred to as a display device, but the example embodiments are not limited thereto.

The processor 100 may generally control the display system 1000. For example, the processor 100 may generate image data IDT to be displayed on the display panel 300, and may transmit the image data IDT and/or at least one control command CMD to the display driving circuit 200, etc. The processor 100 may be a graphics processor, but the example embodiments of the inventive concepts are not limited thereto, and for example, the processor 100 and/or display driving circuit 200 may be implemented as processing circuitry. The processing circuitry may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto.

Although not shown, the processor 100 may include a pixel rendering circuit and/or a dithering circuit, etc., but is not limited thereto.

Although not shown, a plurality of filters for pixel rendering and/or a plurality of masks for dithering may be generated (and/or previously generated) based on a pixel arrangement pattern with respect to each of a plurality of sub-regions of an under-display camera (UDC) region. According to at least one example embodiment, an external device may generate a filter and/or mask for each sub-region based on the pixel arrangement pattern (and/or physical layout of the pixels, etc.) with respect to each of the plurality of sub-regions of the display panel 300, but the example embodiments are not limited thereto, and for example the filter and/or mask may be generated by the processor 100, etc. For example, the pixel arrangement pattern may be determined based on an arrangement structure between an emission pixel and/or a non-emission pixel with respect to each of the plurality of sub-regions of the UDC region, etc. For pixel rendering, the previously generated filter and/or mask may be stored in a memory of the display device and/or display system 1000 together with its corresponding spatial coordinate value. Herein, the non-emission pixel may correspond to a pixel which is structurally and/or functionally constrained by the camera module and does not emit light in the UDC region. The non-emission pixel may have a lack of configuration compared to the emission pixel, or in other words, the non-emission pixel may be non-functional and/or may be configured to not function. In some example embodiments, the non-emission pixel has the same structural configuration as the emission pixel, but may be limited to non-emission (e.g., the non-emission pixel may be controlled so that it does not perform any emission, etc.).

In at least one example embodiment, the pixel rendering circuit may select a filter used for pixel rendering based on a spatial coordinate value of the received image data. Herein, selecting a filter may mean and/or refer to determining a filter index based on a spatial coordinate value of image data, but is not limited thereto. The selected filter may mean and/or refer to a filter corresponding to the spatial coordinate value of the received image data from among a plurality of generated filters (e.g., previously generated filters, etc.) associated with the display panel 300 and/or UDC region, etc. The pixel rendering circuit may perform pixel rendering using the selected filter. For example, the pixel rendering circuit may perform first pixel rendering on the plurality of sub-regions of the UDC region of the display panel 300 by using a selected first filter and may perform a second pixel rendering on a non-UDC region of the display panel 300 by using a selected second filter, etc.

In at least one example embodiment, the pixel rendering circuit may be configured to perform first pixel rendering and/or second pixel rendering in parallel, but the example embodiments are not limited thereto.

In at least one example embodiment, the dithering circuit may select a mask to be dithered from among generated masks (and/or previously generated masks, etc.) based on the spatial coordinate value of the received image data. The selected mask may mean and/or refer to a mask corresponding to the spatial coordinate value of received image data from among a plurality of generated masks (e.g., previously generated masks, etc.). For example, the dithering circuit may perform dithering by setting a desired and/or previously determined frequency offset with respect to each of the plurality of sub-regions by using the selected mask.

The display panel 300 is a display on which an actual image is displayed, and may be one of a plurality of display device types which receive an electrically transmitted image signal and display a two-dimensional image, such as a thin film transistor-liquid crystal display (TFT-LCD), an organic emission diode (OLED) display, a field emission display, a plasma display panel (PDP), etc., but is not limited thereto. In at least one example embodiment, the display panel 300 may be an OLED display panel in which each of the pixels includes an OLED. However, the example embodiments of the inventive concepts are not limited thereto, and the display panel 300 may be implemented as another type of flat panel display and/or flexible display panel, etc.

The display driving circuit 200 may display an image on the display panel 300 by converting the image data IDT received from the processor 100 into image signals for driving the display panel 300, and supplying the converted image signals to the display panel 300.

In addition, an image may be displayed on an UDC region 310 of the display panel 300 according to and/or based on an operation mode (e.g., a front camera operation mode, etc.) of the display driving circuit 200. The UDC region 310 may mean and/or refer to a region of the display panel 300 in which the camera module is under. For example, the UDC region 310 may mean and/or refer to a region to which the camera module is visually exposed (e.g., visible) through at least a partial region of the display panel 300 in the display system 1000 including the camera module, but the example embodiments are not limited thereto. For another example, at least a part of the camera module may be under the display module 300 (e.g., the camera module may be partially visible) and configured to enable capturing of a subject through a part of an active region of the display module 300. For another example, the camera module may not be visually exposed (e.g., not visible) in the region of the display module 300. A non-UDC region 320 may mean and/or refer to at least a part of the remaining region in the display panel 300 minus the UDC region 310.

The UDC region 310 does not mean and/or refer to a fixed region in the display panel 300, and the position, size, number, etc. of camera modules on the display panel 300 may change over time and/or according to driving conditions, etc.

In FIG. 1, the display panel 300 is illustrated to include the UDC region 310 and the non-UDC region 320, but the example embodiments are not limited thereto. In at least one example embodiment, the display panel 300 may further include a boundary region between the UDC region 310 and the non-UDC region 320, etc.

Figure 2:
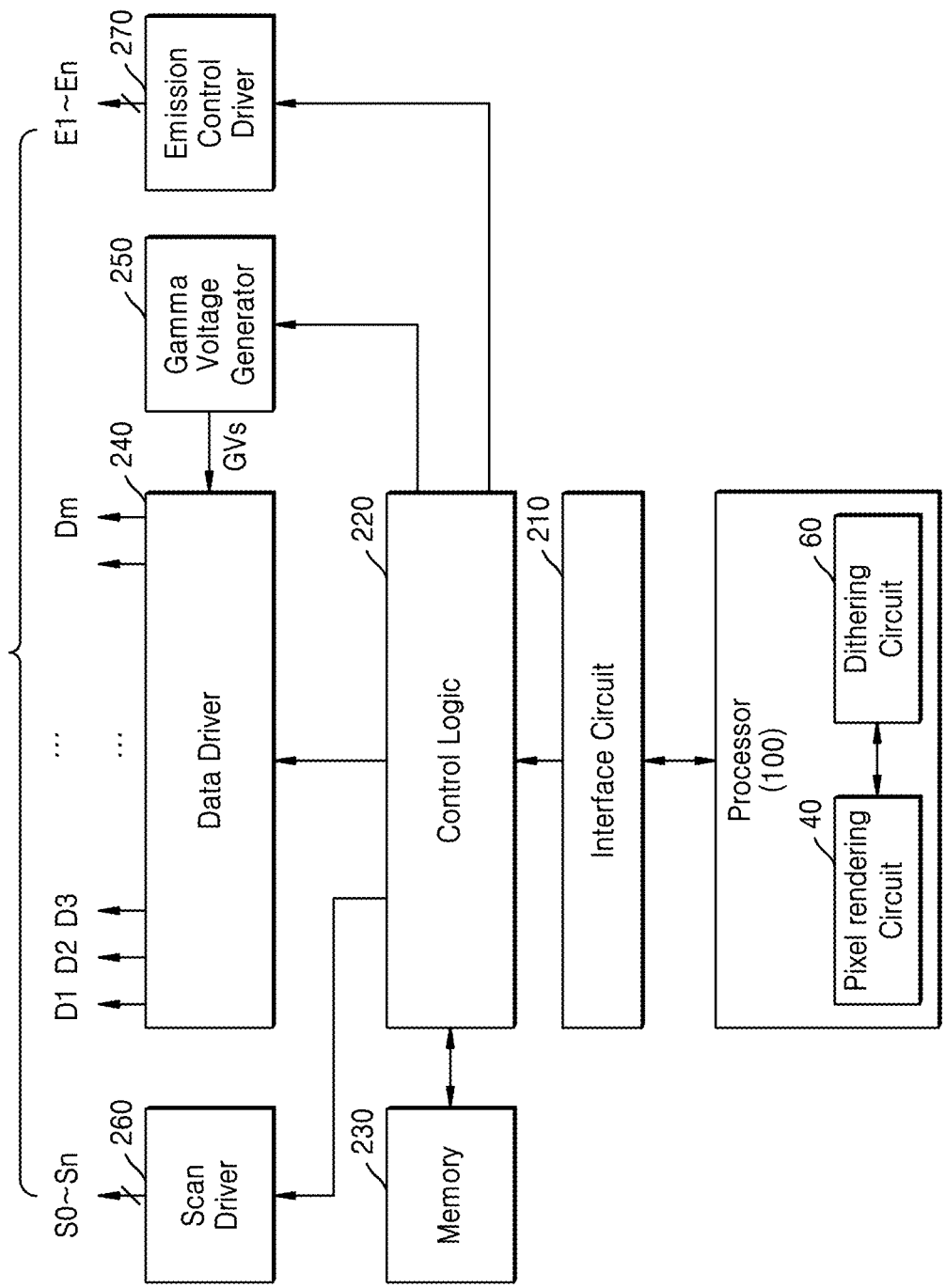
FIG. 2 is a block diagram illustrating a display driving circuit according to at least one example embodiment.

FIG. 2 is a block diagram illustrating the display driving circuit 200 according to at least one example embodiment.

Referring to FIG. 2, the display driving circuit 200 may include an interface circuit 210, a control logic 220, a memory 230, a data driver 240, a gamma voltage generator 250, a scan driver 260, and/or an emission control driver 270, but is not limited thereto, and for example, may include a greater or lesser number of constituent components, etc. In at least one example embodiment, the interface circuit 210, the control logic 220, the memory 230, the data driver 240, the gamma voltage generator 250, the scan driver 260, and/or the emission control driver 270 may be integrated into a single semiconductor chip, but is not limited thereto. For example, the interface circuit 210, the control logic 220, the memory 230, the data driver 240, the gamma voltage generator 250, the scan driver 260, and/or the emission control driver 270, etc., may be implemented as processing circuitry. The processing circuitry may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto. Additionally, the interface circuit 210, the control logic 220, the memory 230, the data driver 240, the gamma voltage generator 250, the scan driver 260, and/or the emission control driver 270, etc., may be formed on and/or included in the display panel (e.g., display panel 300 of FIG. 1), but is not limited thereto. For example, the display panel 300 may be generated through a low temperature poly silicon (LTPS) process after forming an amorphous silicon layer on a glass substrate, and a thin film transistor of an LTPS display panel may have a fast response speed and/or uniformity, but the example embodiments are not limited thereto. As described above, a plurality of transistors may be formed using polysilicon formed by an LTPS process, and may be used to form the scan driver 260 and/or the emission control driver 270, etc., on the display panel 300.

According to some example embodiments, the processor 100 may include a pixel rendering circuit 40 and/or a dithering circuit 60, etc.

In at least one example embodiment, although not shown, for pixel rendering, a filter and/or a mask may be generated (and/or previously generated) based on a pixel arrangement pattern of an UDC region. The generated (and/or previously generated) filter for pixel rendering and/or the generated (and/or previously generated) mask for dithering may be stored together with the corresponding spatial coordinate value in a memory of a display device, but the example embodiments are not limited thereto.

The pixel arrangement pattern for each sub-region may be determined based on at least one of an arrangement structure (e.g., physical structure) between emission pixels and non-emission pixels in each sub-region, an amount of pixel loss in the UDC region compared to a non-UDC region, an amount of change in the pixel size, and/or an amount of change in the pixel position, etc., but the example embodiments are not limited thereto.

In at least one example embodiment, the pixel rendering circuit 40 may select a filter used for pixel rendering based on the spatial coordinate value of the received image data. Herein, selecting a filter may mean and/or refer to determining a filter index based on the spatial coordinate value of image data. The selected filter may refer to a filter corresponding to a spatial coordinate value received among a plurality of generated (and/or previously generated) filters.

The pixel rendering circuit 40 may perform pixel rendering using the selected filter. For example, the pixel rendering circuit 40 may perform first pixel rendering using a first filter selected for each of the plurality of sub-regions of the UDC region and the image data, and second pixel rendering using a second filter selected with respect to the non-UDC region and the image data, etc.

In at least one example embodiment, the pixel rendering circuit 40 may be configured to perform first pixel rendering and second pixel rendering in parallel, but is not limited thereto.

In at least one example embodiment, the dithering circuit 60 may select a mask to be dithered from among generated (and/or previously generated) masks based on the spatial coordinate value of the received image data. The selected mask may mean and/or refer to a mask corresponding to the spatial coordinate value of the received image data from among the plurality of generated masks (and/or previously generated masks), etc.

In at least one example embodiment, the dithering circuit 60 may perform dithering by setting a desired and/or previously determined frequency offset with respect to each of the plurality of sub-regions by using the selected mask.

In at least one example embodiment, the pixel rendering circuit 40 and/or the dithering circuit 60 may be implemented as part of the processor 100. However, the example embodiments of the inventive concepts are not limited thereto, and the pixel rendering circuit 40 and/or the dithering circuit 60 may be implemented as separate logic circuits from the processor 100, etc.

The interface circuit 210 may interface with signals and/or data exchanged between the processor 100 and/or the display driving circuit 200. The interface circuit 210 may be implemented as one of serial interfaces, such as the Mobile Industry Processor Interface (MIPI), the Mobile Display Digital Interface (MDDI), the Display Port, and/or the embedded DisplayPort (eDP), etc., but is not limited thereto.

The control logic 220 may control the overall operation of the display driving circuit 200, and may control configurations of the display driving circuit 200, for example, the interface circuit 210, the memory 230, the data driver 240, the gamma voltage generator 250, the scan driver 260, and/or the emission control driver 270, etc., to display image data received from the processor 100 on the display panel 300. In addition, the control logic 220 may perform image processing for luminance change, size change, format change, etc., on the received image data, and/or generate new image data to be displayed on the display panel 300 based on the received image data, but the example embodiments are not limited thereto.

The memory 230 may store the image data received from the processor 100 in units of frames, but is not limited thereto. The memory 230 may be referred to as graphics random access memory (GRAM), a frame buffer, etc. The memory 230 may include a volatile memory, such as dynamic random access memory (DRAM) and/or static random access memory (SRAM), and/or a non-volatile memory, such as ROM, flash memory, resistive random access memory (ReRAM), magnetic random access memory (MRAM), etc., but the example embodiments are not limited thereto. The memory 230 may store a plurality of filters used for pixel rendering with respect to the UDC region including a plurality of sub-regions (e.g., sub-UDC regions, etc.). For example, the memory 230 may be used for pixel rendering on the UDC region, and store at least one filter and/or at least one mask generated (and/or previously generated) based on a pixel arrangement pattern of the UDC region, etc.

In at least one example embodiment, symbol image data (e.g., standardized numbers, letters, fonts, symbols, special characters, etc.) received from the processor 100 and/or partial image frames including standardized images, such as a time screen, a date screen, etc., may be stored in the memory 230. However, the example embodiments of the inventive concepts are not limited thereto, and the display driving circuit 200 may further include a separate memory physically separated from the memory 230, for example, a symbol memory, etc., and the symbol image data and/or the partial image frames may be stored in the symbol memory, etc.

The control logic 220 may provide the image data stored in the memory 230 and/or the image data received from the interface circuit 210 to the data driver 240 in a line data unit, that is, in a pixel data unit corresponding to one horizontal line of the display panel 300, but the example embodiments are not limited thereto. The data driver 240 may include a plurality of decoders that convert the received data into an image signal based on a plurality of gamma voltages GVs (also referred to as grayscale voltages) received from the gamma voltage generator 250 and a plurality of amplifiers respectively connected to the plurality of decoders, and may convert line data into a plurality of image signals D1 to Dm (where m is an integer greater than or equal to 2) and output the plurality of image signals D1 to Dm to the display panel 300.

The gamma voltage generator 250 may generate the plurality of gamma voltages GVs, for example, gamma voltages GVs of 256 gray scales, based on a set gamma curve, and provide the gamma voltages GVs to the data driver 240. The gamma voltage generator 250 may change the highest gamma voltage and/or the lowest gamma voltage according to, for example, a control register value, and change the gamma curve, under the control of the control logic 220, but the example embodiments are not limited thereto.

Operations of the data driver 240, the scan driver 260, and the emission control driver 270 are described with reference to FIG. 3.

Figure 3:
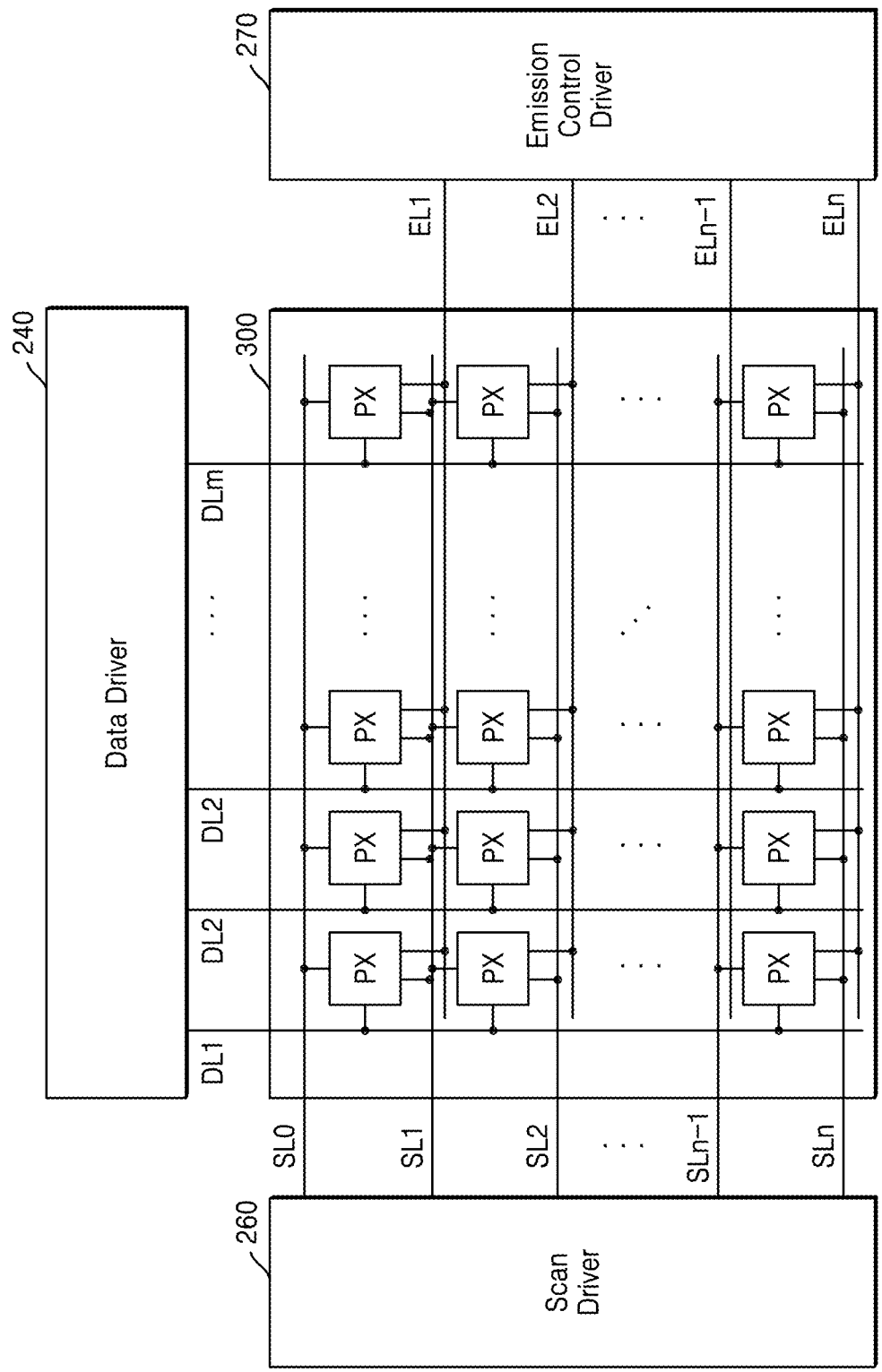
FIG. 3 is a block diagram illustrating a display panel of FIG. 1 and an operating method of the display panel according to some example embodiments.

FIG. 3 is a block diagram illustrating the display panel 300 of FIG. 1 and an operating method of the display panel 300. An OLED panel is described as an example of the display panel 300, however the example embodiments are not limited thereto, and other types of display panels may be used.

Referring to FIG. 3, the display panel 300 may include a plurality of data lines DL1 to DLm, a plurality of scan lines SL0 to SLn, a plurality of emission control lines EL1 to Eln, and a plurality of pixels PX included between the lines. Each of the plurality of pixels PX may be connected to its corresponding scan line SL, data line DL, and/or emission control line EL, etc.

Each of the plurality of pixels PX may output light of a desired and/or preset color, and two or more pixels PX adjacent to each other on the same or adjacent line and outputting light of different desired colors (e.g., red, blue, and/or green pixels, etc.) may constitute one unit pixel (e.g., pixel unit, etc.). In this regard, the two or more pixels PX constituting and/or included in a single unit pixel may be referred to as sub-pixels of the unit pixel. The display panel 300 may have an RGB structure in which, e.g., red, blue, and green pixels (e.g., sub-pixels) constitute and/or are considered a single unit pixel. However, the example embodiments of the inventive concepts are not limited thereto, and the display panel 300 may have an alternate sub-pixel structure, such as an RGBW structure in which the unit pixel further includes a white pixel for improving luminance, etc. Additionally, the unit pixel of the display panel 300 may include a combination of pixels of colors other than the red, green, and blue colors, etc.

In FIG. 3, for the sake of convenience and/or clarity, the plurality of pixels PX are illustrated as being arranged in a constant and/or set pattern, but the patterns and/or configurations of pixels of an UDC region may vary and may be different from the patterns and/or configurations of pixels of a non-UDC region.

The scan driver 260 is connected to the plurality of scan lines SL0 to SLn, and sequentially applies a scan signal to the pixels PX line in a line unit to sequentially select the pixels PX.

The emission control driver 270 is connected to the plurality of emission control lines EL1 to ELn, and sequentially applies the emission control signals E1 to En to the pixels PX to control the emission time of the pixels PX.

As described with reference to FIG. 2, the scan driver 260 may generate and/or provide the plurality of image signals (e.g., D1 to Dm in FIG. 2, etc.) to the pixels PX through the plurality of data lines DL1 to DLm, respectively.

Figure 4:
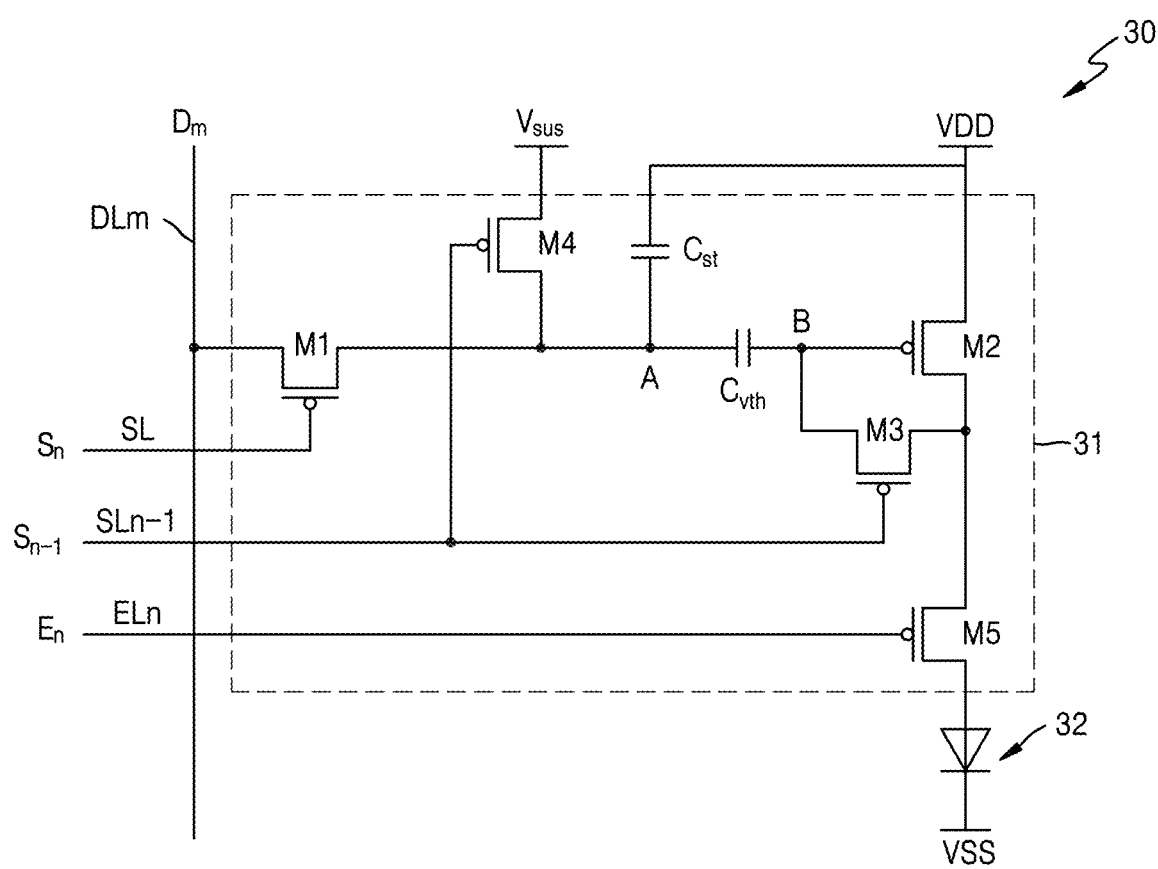
FIG. 4 is a circuit diagram illustrating an implementation example of a pixel of FIG. 3 according to some example embodiments.

FIG. 4 is a circuit diagram illustrating an implementation example of a pixel 30 of FIG. 3 according to some example embodiments.

Referring to FIG. 4, the pixel 30 may include a pixel driver 31 and/or an OLED 32, but the example embodiments are not limited thereto.

The pixel driver 31 may receive the image signal Dm, a previous scan signal Sn-1, a scan signal Sn (e.g., a current scan signal), and/or the emission control signal En respectively through the data line DLm, the previous scan line SLn-1, the scan line SLn, and/or the emission control line ELn, and may receive a first power voltage VDD and/or a second power voltage Vsus, etc., but is not limited thereto.

A driving current corresponding to the image signal Dm may be supplied to the OLED 32 from the first power voltage VDD.

The OLED 32 includes an anode electrode, a cathode electrode, and/or an organic emission layer, etc. The anode electrode is connected to the pixel driver 31, and the cathode electrode is connected to a ground voltage VSS. Accordingly, the OLED 32 may receive a driving current supplied from the pixel driver 31 and may emit light with an emission luminance corresponding to the amount of the driving current.

For example, as illustrated, the pixel driver 31 may include a plurality of transistors, e.g., first to fifth transistors M1 to M5, and a plurality of capacitors, e.g., capacitors Cst and Cvth, but is not limited thereto. For example, a first electrode of the first transistor M1 is connected to the data line DLm, and a gate terminal thereof is connected to the scan line SLn. In addition, the first transistor M1 is turned on in response to the scan signal Sn transmitted through the scan line SLn and transfers the image signal Dm received through the data line DLm to the two capacitors Cst and Cvth.

The first power voltage VDD may be applied to the first electrode of the second transistor M2, for example, a driving current IOLED corresponding to the image signal Dm, may be generated. The second transistor M2 may be referred to as a driving transistor.

The third transistor M3 is connected between the gate terminal and the second electrode of the second transistor M2 and turned on by the scan signal Sn-1 applied to the gate terminal thereof connected to the previous scan line SLn-1 to compensate for a threshold voltage Vth of the second transistor M2, that is, the driving transistor.

The first capacitor Cvth is connected between the second electrode of the first transistor M1 and the gate terminal of the second transistor M2, and may store the threshold voltage Vth of the second transistor M2.

The second capacitor Cst is connected between the first power voltage VDD and one terminal of the first capacitor Cvth, and may store the image signal Dm transmitted through the data line DLm.

The fourth transistor M4 has a first electrode connected to the second power voltage Vsus, and a second electrode commonly connected to the first capacitor Cvth and the second capacitor Cst. The fourth transistor M4 is turned on in response to the previous scan signal Sn-1 applied to the gate terminal of the fourth transistor M4, and the fourth transistor M4 applies the second power voltage Vsus to the first capacitor Cvth and the second capacitor Cst.

The fifth transistor M5 is connected between the second electrode of the second transistor M2 and the anode electrode of the OLED 32, and performs an on/off operation according to and/or based on control of the emission control signal En applied to the gate terminal of the fifth transistor M5 to supply or block the driving current IOLED supplied from the second transistor M2 to the OLED 32, thereby controlling the emission time of the OLED 32.

An example implementation of the pixel 30 according to some example embodiments has been described with reference to FIG. 4. However, the example embodiments are not limited thereto, and the physical structure and/or arrangement of the pixel 30 may be variously changed, and/or the method of operating the pixel 30 may be variously changed, etc.

Figure 5:
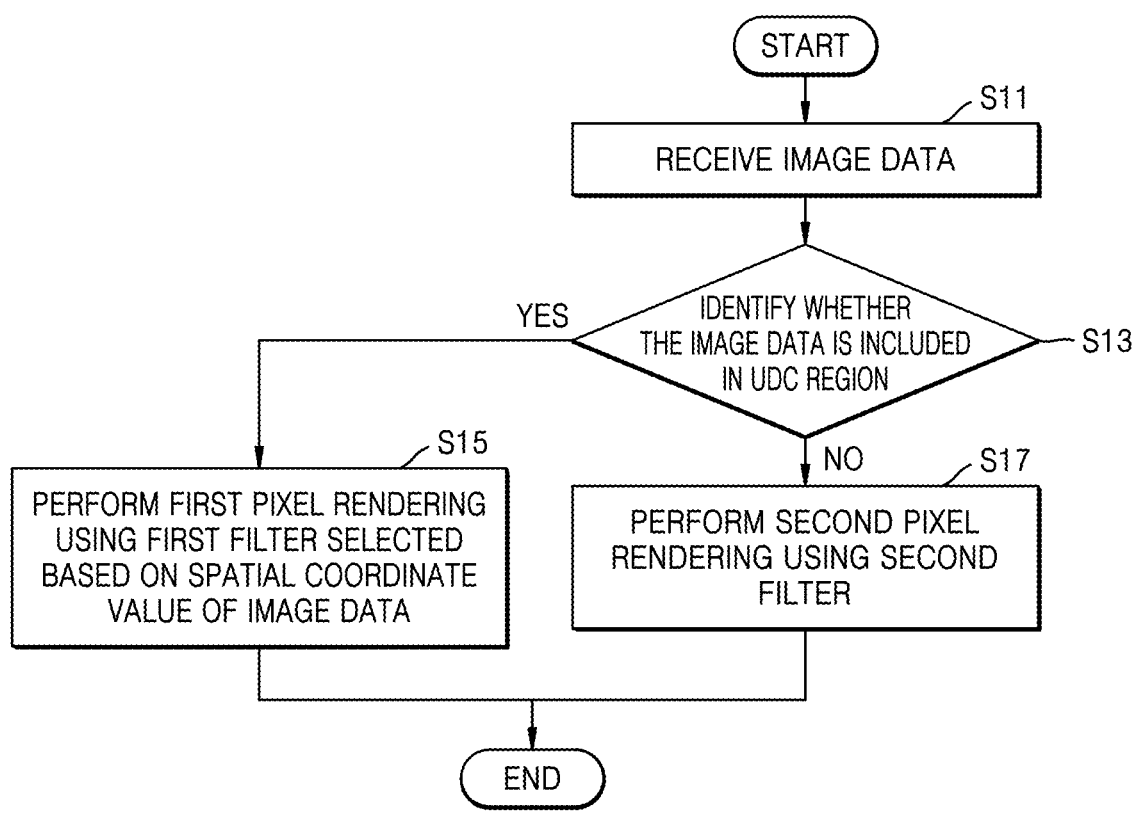
FIG. 5 is a flowchart illustrating an operating method of a display device according to at least one example embodiment.

FIG. 5 is a flowchart illustrating an operating method of a display device according to at least one example embodiment.

Referring to FIG. 5, in operation S11, the at least one processor may receive image data. In at least one example embodiment, the processor may receive image data including a spatial coordinate value of a region and/or sub-region of a display panel on which an image is to be displayed. In other words, the image data may include spatial coordinate values, such as a set of pixel coordinate locations, a center pixel coordinate location, image size information, etc., which indicate the location on the display device that the image data is to be displayed.

In operation S13, the processor may identify whether the spatial coordinate value is included in and/or corresponds to an UDC region. In at least one example embodiment, the processor may identify and/or determine whether the region in which the image is to be displayed is included in and/or corresponds to the UDC region of the display panel, by comparing a stored, determined, and/or previously stored spatial coordinate value of the UDC region of the display panel with the spatial coordinate value of the received image data and determining whether the spatial coordinate value of the received image data is located within, matches, and/or overlaps the stored spatial coordinate value of the UDC region, etc., but is not limited thereto.

In operation S15, when the spatial coordinate value of the received image data is included in the UDC region, the processor may select a first filter based on the spatial coordinate value of the image data and then perform first pixel rendering using the selected first filter.

Although not shown in FIG. 5, a plurality of filters for pixel rendering may be generated and/or previously generated based on a pixel arrangement pattern for each of a plurality of sub-regions of the UDC region. The plurality of first filters may correspond to each of the plurality of sub-regions included in the UDC region, but is not limited thereto.

The pixel arrangement pattern for each sub-region indicates, is based on, and/or corresponds to structural characteristics of the display panel (e.g., the physical arrangement and/or location of pixel units and/or sub-pixels of the sub-regions of the display panel), and may be determined based on at least one of an arrangement structure between emission pixels and non-emission pixels in each sub-region, an amount of pixel loss in the UDC region compared to a non-UDC region, an amount of change in the pixel size in each sub-region, and an amount of change in the pixel position in each sub-region, etc., but the example embodiments are not limited thereto. For pixel rendering, the generated filter and/or previously generated filter may be stored in a memory of the display device together with the corresponding spatial coordinate value, but is not limited thereto.

In at least one example embodiment, the processor may select a filter from the plurality of filters having a spatial coordinate value matching, included in, and/or overlapping the spatial coordinate value of the received image data as the first filter, etc., or in other words, the processor may select the filter based on the spatial coordinate value of the received image data and the filter. For example, the processor may select the first filter corresponding to the received image data from among a plurality of generated and/or previously generated first filters, by searching the memory for the spatial coordinate value of the received image data, etc.

In at least one example embodiment, the processor may perform first pixel rendering by applying the selected first filter to the image data of the UDC region.

In operation S17, when the spatial coordinate value of the received image data is included in the non-UDC region, the processor may perform second pixel rendering on the image data using a second filter. In at least one example embodiment, when the spatial coordinate value of the received image data is identified as the non-UDC region, the processor may perform second pixel rendering on image data of the non-UDC region using the second filter corresponding to a spatial coordinate value of the non-UDC region, but is not limited thereto.

In at least one example embodiment, the processor may perform first pixel rendering on the UDC region and second pixel rendering on the non-UDC region in parallel, but the example embodiments are not limited thereto. Accordingly, undesired and/or unnecessary pixel rendering may be decreased, reduced, and/or prevented by performing first pixel rendering specialized for the UDC region independently of the non-UDC region, thereby decreasing, reducing, and/or preventing image quality degradation and/or waste of hardware resources, etc., as well as increasing the speed of image rendering, etc.

Although not shown, herein, selecting a filter may be interpreted as determining a filter coefficient based on a spatial coordinate value of image data.

Figure 6:
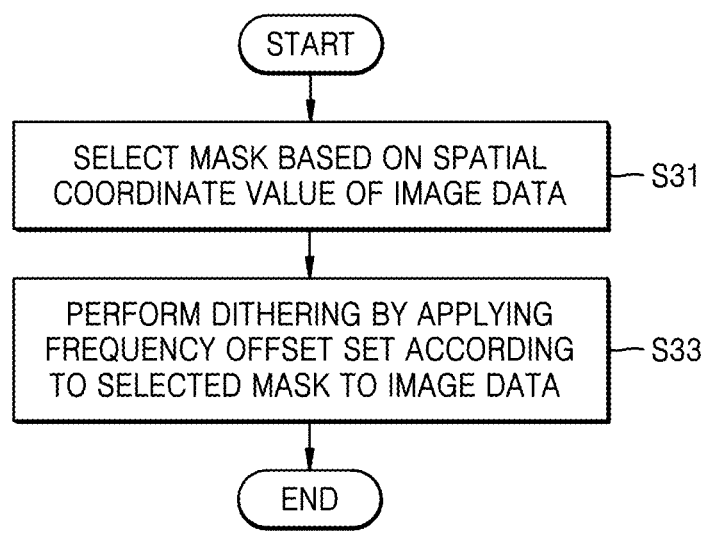
FIG. 6 is a flowchart illustrating a dithering operation of a display device according to at least one example embodiment.

FIG. 6 is a flowchart illustrating a dithering operation of a display device according to at least one example embodiment.

Referring to FIG. 6, in operation S31, at least one processor may select a mask based on a spatial coordinate value of image data.

Although not shown in FIG. 6, a mask for dithering may be generated and/or previously generated based on a pixel arrangement pattern (e.g., physical layout, etc.) for each of a plurality of sub-regions of an UDC region, or in other words a plurality of masks for dithering for each sub-region of an UDC region of a display panel. The plurality of masks for each sub-region may correspond to each of the plurality of sub-regions.

The pixel arrangement pattern for each sub-region indicates and/or includes structural characteristics of a display panel, and may be determined based on at least one of an arrangement structure (and/or physical layout) between emission pixels and non-emission pixels in each sub-region, an amount of pixel loss in the UDC region compared to a non-UDC region, an amount of change in the pixel size in the sub-region, and/or an amount of change in the pixel position in the sub-region, etc. The plurality of masks generated and/or previously generated for dithering may be stored in a memory of the display device together with a spatial coordinate value of its corresponding sub-region.

In at least one example embodiment, the processor may select a mask from the plurality of masks having a spatial coordinate value matching, included in, and/or overlapping the spatial coordinate value of the received image data, as the selected mask. For example, the processor may select a mask corresponding to the received image data from among a plurality of generated and/or previously generated masks, by searching the memory for the spatial coordinate value of the received image data, etc.

In operation S33, the processor may perform dithering, by applying a desired frequency offset set according to and/or based on the selected mask to the image data.

In at least one example embodiment, the processor may perform dithering, by applying the desired frequency offset which changes according to and/or based on a determined and/or previously determined time series to the image data for each of the plurality of sub-regions, but the example embodiments are not limited thereto.

As described with reference to FIG. 6, dithering is performed through and/or using the mask generated based on the pixel arrangement pattern, which is the structural characteristic of the display panel, and thus, the occurrence of a screen door effect in the output image data may be reduced.

Figure 7:
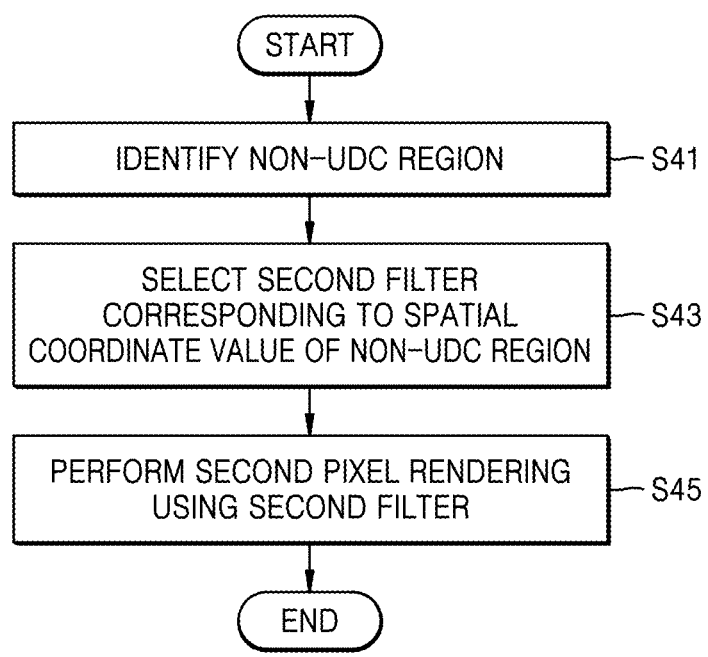
FIG. 7 is a flowchart illustrating a second pixel rendering operation of a display device according to at least one example embodiment.

FIG. 7 is a flowchart illustrating a second pixel rendering operation of a display device according to at least one example embodiment.

Referring to FIG. 7, in operation S41, a non-UDC region may be identified. In at least one example embodiment, at least one processor may store and/or previously store a spatial coordinate value on a display panel (e.g., in a memory included in the display panel and/or a memory associated with the display panel, etc.) with respect to the non-UDC region, and the at least one processor may compare the stored spatial coordinate value of the non-UDC region with a spatial coordinate value of an identified region, thereby identifying the identified region as the non-UDC region.

In operation S43, the processor may select a second filter from a plurality of filters, the second filter corresponding to the spatial coordinate value of the non-UDC region. For example, the second filter may mean and/or refer to a filter for performing second pixel rendering on the non-UDC region. The second filter may match the spatial coordinate value of the non-UDC region and may be stored and/or previously stored in a memory.

In at least one example embodiment, when and/or in response to a target sub-region corresponding to the spatial coordinate value of the image data being the non-UDC region, the processor may select a filter from a plurality of filters corresponding to a spatial coordinate value, e.g., "(x,y,z)" of the image data from among a plurality of second filters stored and/or previously stored in the memory, by searching the memory for the spatial coordinate value "(x, y, z)", but the example embodiments are not limited thereto, and for example, a set of spatial coordinate values may be used to identify the target region corresponding to the image data and/or the region of the display panel, etc., or other means for identifying the boundaries of the target region may be used. For example, the spatial coordinate value 'x' may indicate a relative position of the display panel in a horizontal axis direction (e.g., x-axis), the spatial coordinate value 'y' may indicate a relative position of the display panel in a vertical axis direction (e.g., y-axis), and the spatial coordinate value 'z' may indicate a relative channel on the display panel, but the example embodiments are not limited thereto.

In operation S45, the processor may perform second pixel rendering using the second filter, e.g., perform second pixel rendering for the non-UDC region of the display panel using the second filter, etc.

Figure 8:
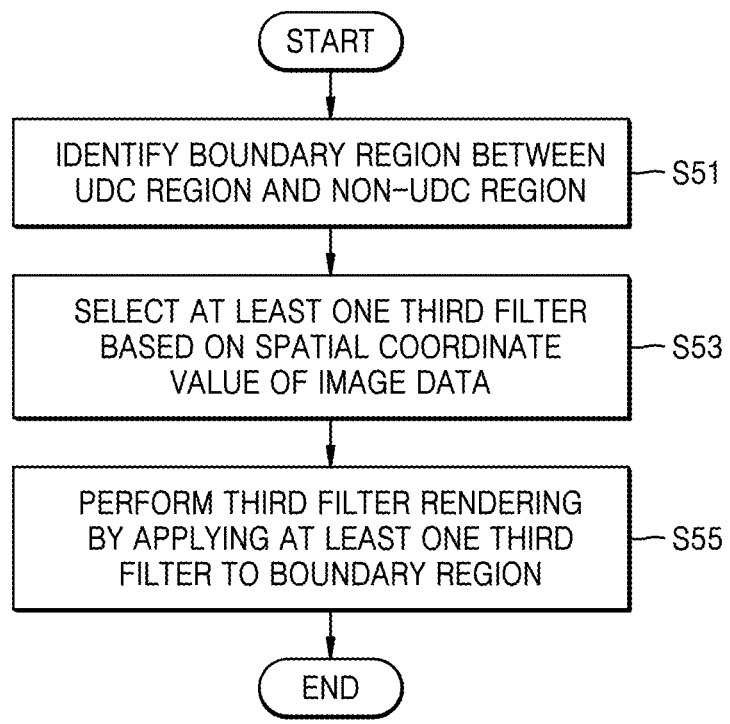
FIG. 8 is a flowchart illustrating a third pixel rendering operation of a display device according to at least one example embodiment.

FIG. 8 is a flowchart illustrating a third pixel rendering operation of a display device according to at least one example embodiment.

Referring to FIG. 8, in operation S51, a boundary region of regions and/or sub-regions of the display panel may be identified based on a spatial coordinate value. For example, at least one processor may store and/or previously store spatial coordinate values corresponding to a display panel with respect to a UDC region and/or a non-UDC region, may compare the stored spatial coordinate values with a spatial coordinate value of a region on which image data is to be displayed, and may thereby identify the identified region as encompassing the boundary region between the UDC region and the non-UDC region.

In operation S53, the processor may select at least one third filter from a plurality of filters based on the spatial coordinate value of the image data, the third filter corresponding to a boundary region of the display panel.

Although not shown in FIG. 8, a third filter for pixel rendering may be generated and/or previously generated based on a pixel arrangement pattern (e.g., physical layout) for the boundary region between the UDC region and the non-UDC region, but is not limited thereto. In some example embodiments, there are a plurality of third filters which may correspond to each of a plurality of sub-boundary regions included in the boundary region.

A pixel arrangement pattern for each sub-boundary region indicates structural characteristics of the display panel at the sub-boundary region, and may be determined based on at least one of an arrangement structure between emission pixels and non-emission pixels in each sub-boundary region, an amount of pixel loss in the UDC region compared to a non-UDC region, an amount of change in the pixel size in the sub-boundary region, and/or an amount of change in the pixel position in the sub-boundary region, etc., but the example embodiments are not limited thereto. For pixel rendering, the generated and/or previously generated filter may be stored in the memory of the display device together with the corresponding spatial coordinate value, but is not limited thereto.

In at least one example embodiment, the processor may select a filter having a spatial coordinate value matching, included in, and/or overlapping the spatial coordinate value of the received image data, as the third filter. For example, the processor may select the third filter corresponding to the received image data from among a plurality of generated and/or previously generated third filters, by searching the memory for spatial coordinate value of the received image data.

In operation S55, the processor may perform third pixel rendering using the selected third filter, or in other words, the processor may perform third pixel rendering on the boundary region based on the selected third filter.

As described with respect to FIG. 8, the processor may perform independent pixel rendering based on the pixel arrangement structure in the boundary region between the UDC region and the non-UDC region of the display panel, thereby decreasing, reducing, and/or preventing overlapping rendering on each region (e.g., the UDC region, the non-UDC region, and the boundary region between the UDC region and the non-UDC region), and may simultaneously perform pixel rendering considering the and/or accommodating the structural characteristics of each region, etc.

Figure 9:
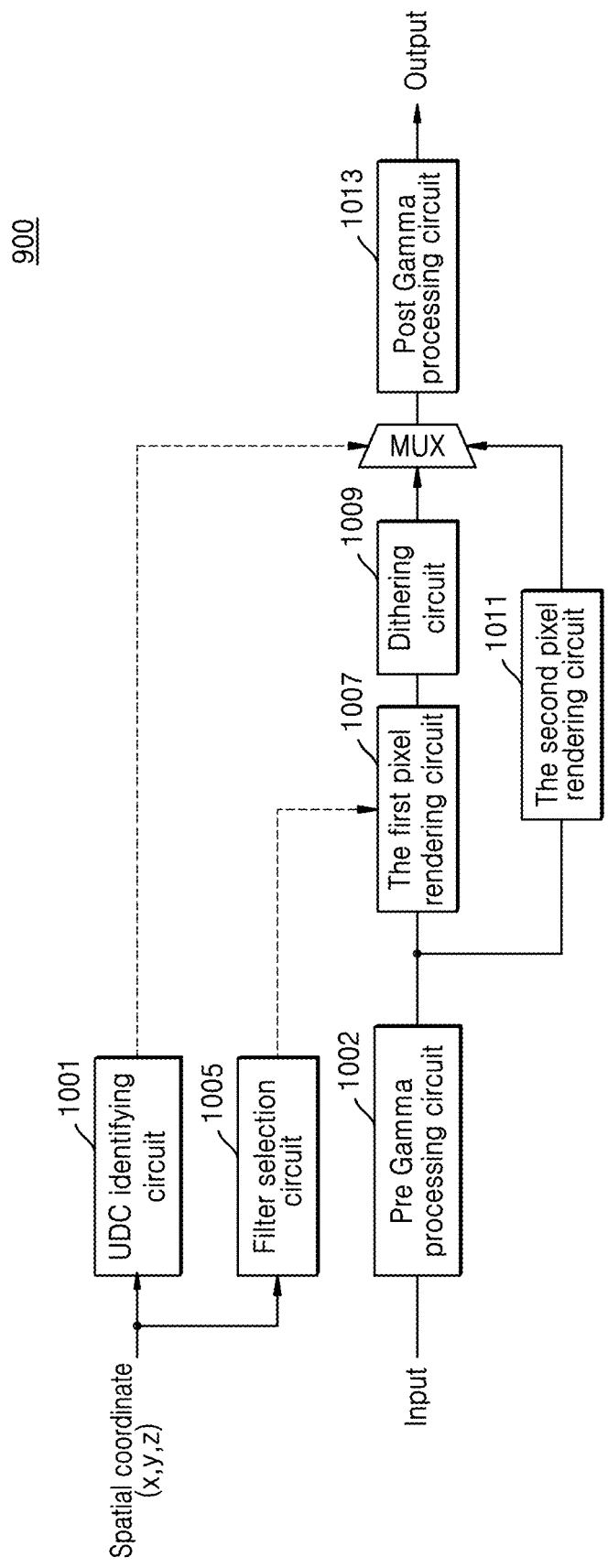
FIG. 9 is a block diagram illustrating rendering operations performed in parallel by a display device according to at least one example embodiment.

FIG. 9 is a block diagram 900 illustrating rendering operations performed in parallel by a display device according to at least one example embodiment.

According to some example embodiments, FIG. 9 is a block diagram illustrating an operation of performing parallel rendering and dithering on images of an UDC region and a non-UDC region, by using the pixel rendering circuit 40 and the dithering circuit 60 of the processor 100 of FIG. 2, but the example embodiments are not limited thereto.

Referring to FIG. 9, in order to perform parallel rendering and dithering on an image, at least one processor may include an UDC identifying circuit 1001, a pre-gamma processing circuit 1002, a filter selection circuit 1005, a first pixel rendering circuit 1007, a dithering circuit 1009, a second pixel rendering circuit 1011, and/or a post-gamma processing circuit 1013, etc., but the example embodiments are not limited thereto, and, e.g., the at least one processor may include a greater or lesser number of constituent components, such as a third pixel rendering circuit, a second dithering circuit, etc.

The pre-gamma processing circuit 1002 may perform pre-gamma processing on received image data Input.

Thereafter, the processor may perform first and second pixel rendering operations in parallel on image data output from the pre-gamma processing circuit 1002, but the example embodiments are not limited thereto and the processor may perform greater number of pixel rendering operations in parallel, or may perform one or more pixel rendering operations serially.

The first pixel rendering operation may be performed by the filter selection circuit 1005 and the first pixel rendering circuit 1007, and the second pixel rendering operation may be performed by the second pixel rendering circuit 1011, but the example embodiments are not limited thereto.

Herein, a path between the first pixel rendering circuit 1007 and a multiplexer may be referred to as a first pixel rendering path, and a path between the second pixel rendering circuit 1011 and the multiplexer may be referred to as a second pixel rendering path, but the example embodiments are not limited thereto. In at least one example embodiment, the display device may perform a rendering operation on the image data Input by using the first and second pixel rendering paths in parallel, but the example embodiments are not limited thereto.

The image data output from the pre-gamma processing circuit 1002 may pass through the first and second pixel rendering paths in parallel.

First, the first pixel rendering circuit 1007 may perform first pixel rendering on the image data Input by using a first filter selected by the filter selection circuit 1005 based on the image data Input. The dithering circuit 1009 may mask the image data output from the first pixel rendering circuit 1007 according to one or more of the example embodiments described with respect to FIG. 1, etc., and then output the masked image data to a multiplexer MUX.

The second pixel rendering circuit 1011 may perform the second rendering operation on the image data Input in parallel with the first pixel rendering circuit 1007.

The UDC identifying circuit 1001 may identify whether the received image data is displayed in the UDC region based on the spatial coordinates, e.g., (x, y, z), of the received image data, but the example embodiments are not limited thereto. The UDC identifying circuit 1001 may generate at least one control signal for controlling the multiplexer MUX based on an identification result. In response to the at least one control signal received from the UDC identifying circuit 1001, the multiplexer MUX may output any one of the image data passing through the first pixel rendering path and the image data passing through the second pixel rendering path to the post-gamma processing circuit 1013, etc., but the example embodiments are not limited thereto.

The post-gamma processing circuit 1013 may output final image data Output by performing a post-gamma processing operation on the image data output from the multiplexer MUX.

Although not shown, a plurality of filters for pixel rendering and/or a plurality of masks for dithering may be generated and/or previously generated based on a pixel arrangement pattern for each of a plurality of sub-regions of the UDC region.

The pixel arrangement pattern for each sub-region may be determined based on at least one of an arrangement structure (e.g., physical structure) between emission pixels and non-emission pixels in each sub-region, an amount of pixel loss in the UDC region compared to the non-UDC region, an amount of change in the pixel size in the sub-region, and/or an amount of change in the pixel position in the sub-region, but the example embodiments are not limited thereto. For pixel rendering, the generated and/or previously generated filter and/or mask may be stored in a memory of the display device together with the corresponding spatial coordinate value, etc., but the example embodiments are not limited thereto.

The UDC identifying circuit 1001 may receive image data, and may identify whether a target region on which image data is to be displayed on the display panel corresponds to the UDC region based on the spatial coordinate value of the image data, but is not limited thereto. In at least one example embodiment, the UDC identifying circuit 1001 may identify whether the target region is the UDC region, by comparing a stored and/or previously stored spatial coordinate value of the UDC region with a spatial coordinate value (e.g., (x,y,z)) of the target region, etc. For example, the spatial coordinate value 'x' may indicate the relative position of the target region in the horizontal axis direction (e.g., x-axis) of the display panel, the spatial coordinate value 'y' may indicate the relative position of the target region in the vertical axis direction (y-axis) of the display panel, and the spatial coordinate value 'z' may indicate a relative channel of the target region on the display panel, but the example embodiments are not limited thereto.

The filter selection circuit 1005 may select at least one first filter based on the spatial coordinate value of the received image data when the target region is identified as corresponding to the UDC region. The selected filter may mean and/or refer to a filter corresponding to a spatial coordinate value of image data among a plurality of generated and/or previously generated filters. Herein, selecting a filter may be interpreted as determining a filter index based on the spatial coordinate value of the image data, but is not limited thereto.

In at least one example embodiment, the filter selection circuit 1005 may select a first filter corresponding to the spatial coordinate value of the target region from among the plurality of first filters stored and/or previously stored in the memory, by searching the memory for the spatial coordinate value of the target region.

When the target region is identified as the UDC region, the first pixel rendering circuit 1007 may perform first pixel rendering on the target region using the selected first filter corresponding to the UDC region.

When the target region is identified as the UDC region, the dithering circuit 1009 may perform dithering based on the spatial coordinate value of the target region using a selected mask corresponding to the UDC region.

In at least one example embodiment, the dithering circuit 1009 may select a mask corresponding to the spatial coordinate value of the target region from among a plurality of masks stored and/or previously stored in the memory, by searching the memory for the spatial coordinate value of the target region.

In at least one example embodiment, the dithering circuit 1009 may perform dithering, by setting a desired and/or previously determined frequency offset with respect to the target region using the selected mask.

The second pixel rendering circuit 1011 may perform second pixel rendering on the target region when the target region is identified as the non-UDC region using a selected second filter corresponding to the non-UDC region.

In at least one example embodiment, when the target region is identified as the non-UDC region, the second pixel rendering circuit 1011 may select a second filter corresponding to the spatial coordinate value of the target region, and may perform second pixel rendering on the target region by using the selected second filter.

In at least one example embodiment, the processor may perform first pixel rendering and second pixel rendering in parallel, but is not limited thereto. For example, the processor may perform first pixel rendering and second pixel rendering in parallel, by selectively outputting first pixel-rendered image data and second pixel-rendered image data through the multiplexer MUX, etc.

The processor may further include a pre-gamma processing circuit 1002 which performs luminance linearization on image data (e.g., data of input red (R), green (G), blue (B), etc.) before pixel rendering, and/or a post gamma processing circuit 1013 which converts the image data into output image data after pixel rendering, but the example embodiments are not limited thereto.

Although not shown in FIG. 9, the processor may perform third pixel rendering on a boundary region by using a third filter selected based on a pixel arrangement pattern of a boundary region between the UDC region and the non-UDC region, etc., but is not limited thereto. The processor may perform third pixel rendering on at least one of first pixel rendering and/or second pixel rendering in parallel, etc.

Figure 10:
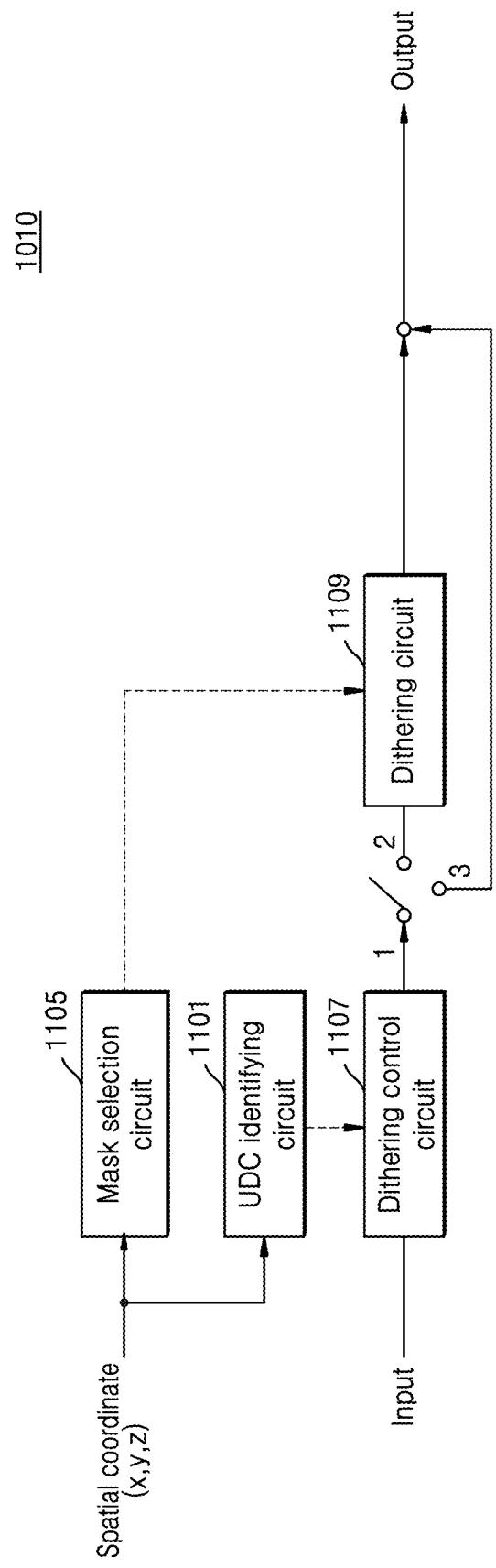
FIG. 10 is a block diagram illustrating masking operations performed by a display device according to at least one example embodiment.

FIG. 9 shows that dithering is performed by the dithering circuit 1009 after a rendering process is performed by the first pixel rendering circuit 1007 on the UDC region, but the example embodiments are not limited thereto. In FIG. 10, as described below, an operation of performing dithering based on a pixel arrangement pattern of the UDC region in order to solve and/or improve a screen door effect problem appearing in an image of the UDC region is described.

The display device according to at least one example embodiment may perform parallel pixel rendering in the UDC region and the non-UDC region based on the pixel arrangement pattern of the display panel, thereby reducing, decreasing, and/or preventing waste of hardware resources due to overlapping filtering and effectively improving the image quality of image data.

FIG. 10 is a block diagram 1010 illustrating masking operations performed by a display device according to at least one example embodiment.

FIG. 10 is a block diagram illustrating an operation for reducing, decreasing, and/or preventing image distortion (e.g., a screen door effect) by performing dithering on an image of an UDC region, by using, e.g., the dithering circuit 60 of the processor 100 of FIG. 2, but the example embodiments are not limited thereto.

Referring to FIG. 10, in order to perform dithering on the image of the UDC region, at least one processor may include a UDC identifying circuit 1101, a mask selection circuit 1105, a dithering control circuit 1107, and/or a dithering circuit 1109, etc., but the example embodiments are not limited thereto.

The UDC identifying circuit 1101 may identify whether received image data is displayed on the UDC region based on the spatial coordinate value(s), e.g., (x, y, z), of the received image data. The UDC identifying circuit 1101 may transmit a signal including the identification result to the dithering control circuit 1107.

For example, the UDC identifying circuit 1101 may identify whether the target region on which the image data is to be displayed is the UDC region based on the spatial coordinate value of the image data. In at least one example embodiment, the UDC identifying circuit 1101 may identify whether the target region is the UDC region, comparing a stored and/or previously stored spatial coordinate value of the UDC region with a spatial coordinate value (e.g., x, y, z) of the target region, but the example embodiments are not limited thereto. For example, the spatial coordinate value 'x' may indicate a relative position of the target region in the horizontal axis direction of the display panel, the spatial coordinate value 'y' may indicate a relative position of the target region in the vertical axis direction of the display panel, and the spatial coordinate value 'z' may indicate a relative channel of the target region on the display panel, etc.

For example, when the spatial coordinate value of the image data belongs to the UDC region, the UDC identifying circuit 1101 may transmit at least one signal including the identification result to the dithering control circuit 1107.

When the spatial coordinate value of the image data belongs to the UDC region, the dithering control circuit 1107 may transmit at least one signal instructing to perform dithering on the image data of the UDC region to the dithering circuit 1109, etc.

For example, when the spatial coordinate value of the image data belongs to the UDC region, the dithering control circuit 1107 configures a switch to connect wires 1 and 2 between the dithering control circuit 1107 and the dithering circuit 1109 to control the dithering circuit 1109 to perform dithering on the image data of the UDC region, but the example embodiments are not limited thereto.

For example, when the spatial coordinate value of the image data belongs to the non-UDC region, the dithering control circuit 1107 configures a switch to connect wires 1 and 3 between the dithering control circuit 1107 and the dithering circuit 1109 to control the dithering circuit 1109 to skip dithering on image data of the non-UDC region, but the example embodiments are not limited thereto.

The mask selection circuit 1105 may select a mask from a plurality of masks based on the spatial coordinate value of the received image data.

For example, the mask selection circuit 1105 may select a mask corresponding to the spatial coordinate value (e.g., (x, y, z)) of the image data from among a plurality of generated and/or previously generated masks. Herein, selecting a mask may be interpreted as determining a mask index based on the spatial coordinate value of the image data, but is not limited thereto.

A mask for dithering may be generated and/or previously generated based on a pixel arrangement pattern for each of a plurality of sub-regions of the UDC region. Each of the generated and/or previously generated masks may match each of the plurality of sub-regions of the UDC region and stored in a memory, etc.

The pixel arrangement pattern for each sub-region may be determined based on at least one of an arrangement structure between emission pixels and non-emission pixels in each sub-region, an amount of pixel loss in the UDC region compared to the non-UDC region, an amount of change in the pixel size in the sub-region, and/or an amount of change in the pixel position in the sub-region, etc.

In at least one example embodiment, the mask selection circuit 1105 may select a mask corresponding to the spatial coordinate value of the target region from among the plurality of masks stored and/or previously stored in the memory, by searching the memory for the spatial coordinate value of the target region.

In at least one example embodiment, the mask selection circuit 1105 may transmit information about the selected mask to the dithering circuit 1109.

When the target region is identified as the UDC region, the dithering circuit 1109 may perform dithering based on the spatial coordinate value of the target region using the selected mask.

In at least one example embodiment, the dithering circuit 1109 may perform dithering, by setting a desired, determined and/or previously determined frequency offset with respect to the target region, using the mask selected by the mask selecting circuit 1105. In this regard, the frequency offset may be randomly set to a different value for each pixel position, but the example embodiments are not limited thereto. In addition, the frequency offset may be changed to a random value according to a desired, determined and/or previously determined period even at the position of the same pixel, but the example embodiments are not limited thereto.

The display device according to at least one example embodiments may perform dithering based on the pixel arrangement pattern for each of the plurality of sub-regions of the UDC region, thereby reducing, decreasing, and/or preventing distortion (e.g., the screen door effect) in the output image data and effectively improving the image quality in the UDC region of the display device.

Figure 11:
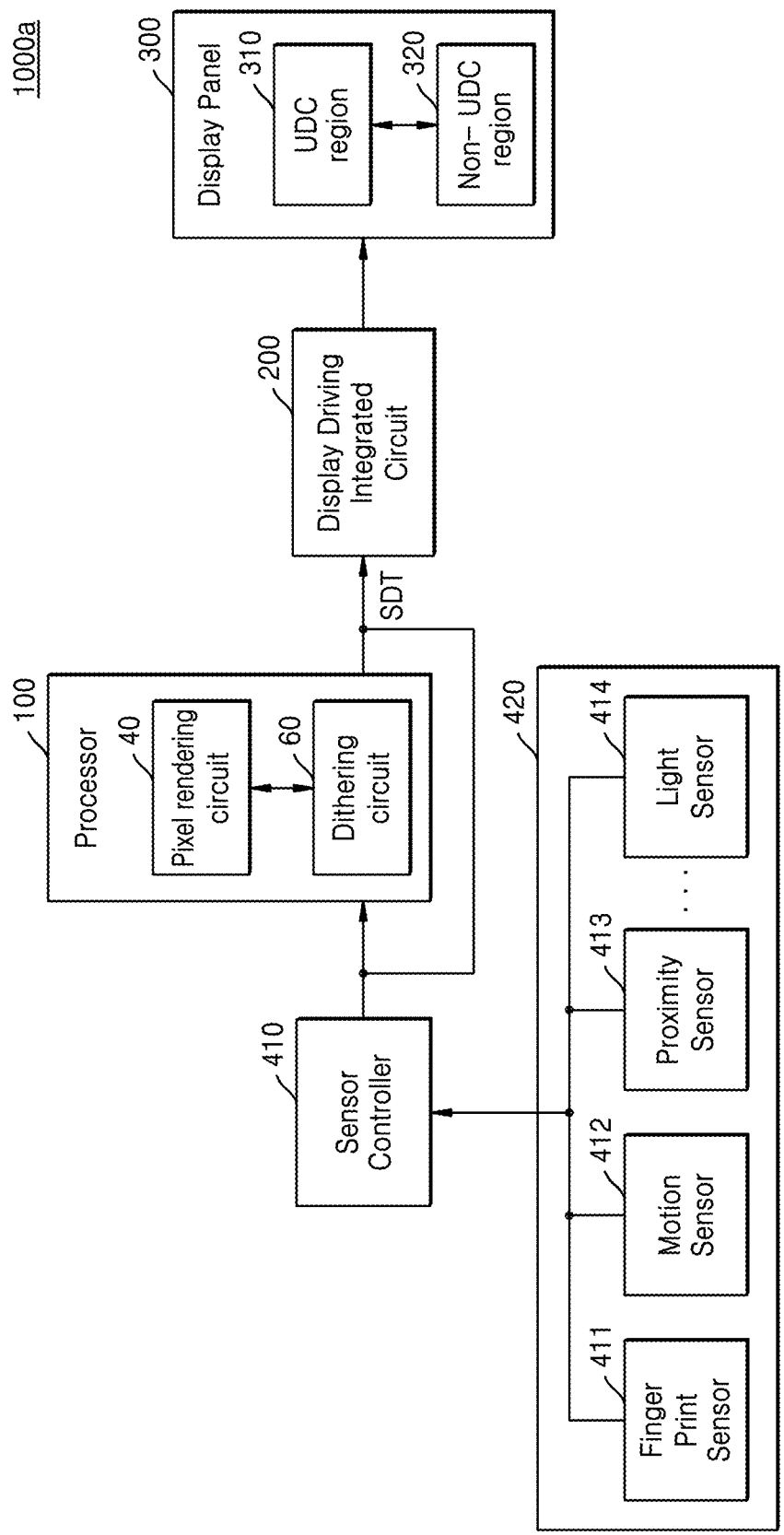
FIG. 11 is a block diagram illustrating a display system according to at least one example embodiment and a diagram illustrating a luminance control method.

FIG. 11 is a block diagram illustrating a display system 1000a according to at least one example embodiment and a diagram illustrating a luminance control method.

Referring to FIG. 11, the display system 1000a may include at least one processor 100, a display driving circuit 200, a display panel 300, a sensor controller 410, and/or a sensor module 420, etc., but is not limited thereto. In at least one example embodiment, the sensor controller 410 and the processor 100 may be mounted on a main board, and/or the sensor controller 410 may be implemented as a part of the processor 100, etc. According to some example embodiments, the at least one processor 100, display driving circuit 200, the sensor controller 410, and/or the sensor module 420, etc., may each be implemented as processing circuitry. The processing circuitry may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto.

The sensor module 420 may include various sensors, for example, a fingerprint sensor 411, a motion sensor 412, a proximity sensor 413, and/or a light sensor 414, etc. The sensors provided in the sensor module 420 may transmit sensing data SDT to the sensor controller 410.

The sensor controller 410 may provide the received sensing data SDT to the display driving circuit 200 through the processor 100 and/or the provide received sensing data SDT to the display driving circuit 200 directly. In at least one example embodiment, when the processor 100 operates in a low power mode, for example, a sleep mode, etc., the sensor controller 410 may directly provide the sensing data SDT to the display driving circuit 200.

Although not shown, a filter for pixel rendering and/or a mask for dithering may be generated and/or previously generated based on a pixel arrangement pattern for each of a plurality of sub-regions of an UDC region. For pixel rendering and/or dithering, a generated and/or previously generated filter and/or mask may be stored in a memory of a display device together with corresponding spatial coordinate value, but the example embodiments are not limited thereto.

The pixel arrangement structure for each sub-region may be determined based on at least one of an arrangement structure (e.g., physical layout, etc.) between emission pixels and non-emission pixels in each sub-region, an amount of pixel loss in the UDC region compared to a non-UDC region, an amount of change in the pixel size in the sub-region, and/or an amount of change in the pixel position in the sub-region, etc.

The pixel rendering circuit 40 may perform pixel rendering on a target region based on a spatial coordinate value of image data. For example, the target region may indicate a UDC region, a non-UDC region, and/or a boundary region, etc.

In at least one example embodiment, when the target region is the UDC region, the pixel rendering circuit 40 may perform first pixel rendering on the UDC region, by using at least one first filter selected based on the spatial coordinate value of image data.

In at least one example embodiment, when the target region is the non-UDC region, the pixel rendering circuit 40 may perform second pixel rendering on the non-UDC region, by using a second filter that is a filter for and/or corresponding to the non-UDC region.

In at least one example embodiment, when the target region is a boundary region between the UDC region and the non-UDC region, the pixel rendering circuit 40 may perform third pixel rendering on the boundary region, by using a third filter selected based on the spatial coordinate value of the image data.

In at least one example embodiment, the pixel rendering circuit 40 may perform at least two pixel renderings among first pixel rendering, second pixel rendering, and third pixel rendering in parallel, but the example embodiments are not limited thereto. Herein, selecting a filter may be interpreted as determining a filter index based on the spatial coordinate value of the image data, but is not limited thereto.

The dithering circuit 60 may perform dithering on the target region using a mask selected from a plurality of masks based on the spatial coordinate value of the image data. The selected mask may mean and/or refer to a mask corresponding to the spatial coordinate value of the target region from among a plurality of generated and/or previously generated masks.

In at least one example embodiment, the dithering circuit 60 may perform dithering, by setting a desired and/or previously determined frequency offset with respect to the target region using the selected mask.

As shown in FIG. 11, pixel rendering may be performed based on structural characteristics (e.g., the physical layout) of each region of the display panel, and thus, the image quality degradation in the UDC region may be adaptively improved, and waste of hardware resources due to overlapping pixel rendering may be reduced, decreased, and/or prevented. In addition, dithering may be performed by reflecting the structural characteristics of the display panel, and thus, noise of output image data may be reduced and/or improved, thereby reducing the screen door effect.

While various example embodiments of the inventive concepts have been particularly shown and described, it will be understood that various changes in form and details may be made therein without departing from the spirit and scope of the following claims.

What is claimed is:

1. A display device comprising:
a display panel including an under display camera (UDC) region and a non-UDC region, the UDC region including a plurality of sub-regions; and
processing circuitry configured to,
receive image data to be displayed on the display panel,
select at least one first filter from a plurality of filters based on spatial coordinate values of the received image data and spatial coordinate values associated of the plurality of filters corresponding to a respective with the plurality of filters, each of sub-region of the plurality of sub-regions, and
perform first pixel rendering for the UDC region based on the at least one first filter and the image data, the at least one first filter generated based on a pixel arrangement pattern of the UDC region, and
display the first pixel rendering on the UDC region of the display panel.

2. The display device of claim 1, wherein the processing circuitry is further configured to:
select a second filter from the plurality of filters based on a spatial coordinate value of the non-UDC region;
perform second pixel rendering for the non-UDC region based on the second filter and the image data; and
display the second pixel rendering on the non-UDC region of the display panel.

3. The display device of claim 2, wherein the processing circuitry is further configured to:
perform the first pixel rendering on the UDC region and the second pixel rendering on the non-UDC region in parallel.

4. The display device of claim 1, wherein the pixel arrangement pattern based on at least one of:
an arrangement structure between emission pixels and non-emission pixels in each sub-region of the plurality of sub-regions, an amount of pixel loss in each sub-region of the plurality of sub-regions compared to the non-UDC region, an amount of change in a pixel size in each sub-region; an amount of change in a pixel position in each sub-region, or any combinations thereof.

5. The display device of claim 4, wherein the processing circuitry is further configured to:
select a mask from a plurality of masks based on the pixel arrangement pattern corresponding to the UDC region on which the first pixel rendering is performed; and
perform dithering using the selected mask and the image data.

6. The display device of claim 5, wherein the processing circuitry is further configured to perform the dithering by:
applying a desired frequency offset to each of the plurality of sub-regions according to the selected mask.

7. The display device of claim 4, wherein the processing circuitry is further configured to,
select at least one third filter from the plurality of filters based on the spatial coordinate value of the image data, the selected at least one third filter corresponding to a boundary region between the UDC region and the non-UDC region, perform third pixel rendering on the boundary region by using the at least one third filter, and
display the third pixel rendering on the boundary region of the display panel; and
the at least one third filter is generated based on a pixel arrangement structure of the boundary region.

8. An operating method of a display device, comprising:
receiving image data to be displayed on a display panel;
selecting at least one first filter from a plurality of filters based on spatial coordinate value of the received image data and spatial coordinate values associated with the plurality of filters, each of the at least one first filter corresponding to a respective sub-region of a plurality of sub-regions of a display panel, the display panel including an under-display camera (UDC) region including the plurality of sub-regions and a non-UDC region;
performing first pixel rendering on the UDC region based on the at least one first filter and the image data, the at least one first filter generated based on a pixel arrangement pattern of the UDC region; and
display the first pixel rendering on the UDC region of the display panel.

9. The operating method of claim 8, further comprising:
selecting a second filter from the plurality of filters based on a spatial coordinate value of the non-UDC region;
performing second pixel rendering for the non-UDC region based on the second filter and the image data;
displaying the second pixel rendering on the non-UDC region of the display panel.

10. The operating method of claim 9, further comprising:
performing the first pixel rendering on the UDC region and the second pixel rendering on the non-UDC region in parallel.

11. The operating method of claim 8, wherein the pixel arrangement pattern is determined based on at least one of:
an arrangement structure between emission pixels and non-emission pixels in each of the plurality of sub-regions, an amount of pixel loss in each sub-region of the plurality of sub-regions compared to the non-UDC region, an amount of change in a pixel size in each sub-region; an amount of change in a pixel position in each sub-region, or any combinations thereof.

12. The operating method of claim 11, further comprising:
selecting a mask from a plurality of masks based on the pixel arrangement pattern corresponding to the UDC region on which the first pixel rendering is performed; and
performing dithering using the selected mask and the image data.

13. The operating method of claim 12, wherein the performing of the dithering further comprises:
applying a desired frequency offset to each of the plurality of sub-regions according to the selected mask.

14. The operating method of claim 11, further comprising:
selecting at least one third filter from the plurality of filters based on the spatial coordinate value of the image data, the selected at least one third filter corresponding to a boundary region between the UDC region and the non-UDC region;
performing third pixel rendering on the boundary region by using the at least one third filter, the at least one third filter generated based on a pixel arrangement structure of the boundary region; and
displaying the third pixel rendering on the boundary region of the display panel.

15. A display device comprising:
a display panel including an under-display camera (UDC) region and a non-UDC region, the UDC region including a plurality of sub-regions; and processing circuitry configured to, receive image data to be displayed on the display panel, use a first rendering path on the UDC region to render first pixels for the UDC region, the rendering the first pixels including selecting at least one first filter from a plurality of filters based on spatial coordinate values of the received image data and spatial coordinate values associated with the plurality of filters, each of the at least one first filter corresponding to a respective sub-region of a plurality of sub-regions of a display panel,
use a second rendering path on the non-UDC region to render second pixels for the non-UDC region in parallel to the first rendering path, the rendering the second pixels including applying a second filter on the non-UDC region,
perform dithering on the UDC region based on a pixel arrangement pattern of the UDC region, and
display the first pixels on the UDC region of the display panel and the second pixels on the non-UDC region of the display panel.

16. The display device of claim 15, wherein the at least one first filter generated based on the pixel arrangement pattern of the UDC region; and the second filter corresponds to spatial coordinate values of the non-UDC region.

17. The display device of claim 15, wherein the pixel arrangement pattern is based on at least one of:
an arrangement structure between emission pixels and non-emission pixels of the UDC region, an amount of pixel loss in a target sub-region of the UDC region compared to the non-UDC region, an amount of change in a pixel size of the UDC region, an amount of change in a pixel position of the UDC region, or any combinations thereof.

18. The display device of claim 15, wherein the processing circuitry is further configured to:
select a mask from a plurality of masks based on spatial coordinate values of the UDC region; and
perform dithering using the selected mask and image data of the first rendering path.

19. The display device of claim 18, wherein the processing circuitry is further configured to perform the dithering by:
setting a desired frequency offset associated with the image data of the first rendering path based on the selected mask.

20. The display device of claim 15, wherein
the processing circuitry is further configured to use the first rendering path, the second rendering path, and a third rendering path to perform first pixel rendering, second pixel rendering, and third pixel rendering, respectively, in parallel, the third rendering path corresponding to a boundary region between the UDC region and the non-UDC region; and
the third rendering path is configured to apply at least one third filter on the boundary region, the at least one third filter selected from a plurality of filters based on a pixel arrangement pattern of the boundary region.

* * * * *